United States Patent [19]

Beasom

[11] Patent Number: 5,338,960

[45] Date of Patent: Aug. 16, 1994

[54] FORMATION OF DUAL POLARITY SOURCE/DRAIN EXTENSIONS IN LATERAL COMPLEMENTARY CHANNEL MOS ARCHITECTURES

[75] Inventor: James D. Beasom, Melbourne Village, Fla.

[73] Assignee: Harris Corporation, Melbourne, Fla.

[21] Appl. No.: 925,077

[22] Filed: Aug. 5, 1992

[51] Int. Cl.$^5$ .................. H01L 29/68; H01L 21/265
[52] U.S. Cl. ..................... 257/335; 257/327; 257/338; 257/369; 257/408; 257/409; 437/41; 437/56; 437/58; 437/150; 437/152; 437/913
[58] Field of Search .............. 257/327, 335, 338, 369, 257/408, 409; 437/41, 56, 58, 150, 152, 913

[56] References Cited

U.S. PATENT DOCUMENTS

5,170,232  12/1992  Narita ..................... 257/338

Primary Examiner—Edward Wojciechowicz
Attorney, Agent, or Firm—Charles E. Wands

[57] ABSTRACT

Dual polarity source/drain extensions are formed simultaneously in both PMOS and NMOS devices of a CMOS architecture using a common set of implants, so to be contiguous with one or both of source and drain regions of both the PMOS and the NMOS structures. The complementary conductivity lateral extension region configuration may be either an N over P or a P over N structure. The dual implant methodology can be carried out with no explicit masking steps, yielding MOS device which have source/drain extension regions that are self aligned to the gate and have minimal overlap capacitance.

28 Claims, 2 Drawing Sheets

FORMATION OF DUAL POLARITY SOURCE/DRAIN EXTENSIONS IN LATERAL COMPLEMENTARY CHANNEL MOS ARCHITECTURES

FIELD OF THE INVENTION

The present invention relates in general to the manufacture of integrated circuits and is particularly directed to a methodology that uses the same sequence of implant steps to form dual polarity conductivity extensions for both drain and source regions of complementary channel MOS structures.

BACKGROUND OF THE INVENTION

U.S. Pat. No. 4,823,173, entitled "High Voltage Lateral MOS Structure with Depleted Top Gate Region," issued Jan. 7, 1989, assigned to the assignee of the present application and the disclosure of which is herein incorporated, describes the formation of a drain-extension drift region in a lateral MOS structure in order to increase reverse breakdown voltage and reduce on-resistance. By adding such a lateral drift region to what is otherwise a low voltage structure, the device can be effectively transformed into a substantially increased (reverse breakdown) voltage MOS device.

Figure 1:
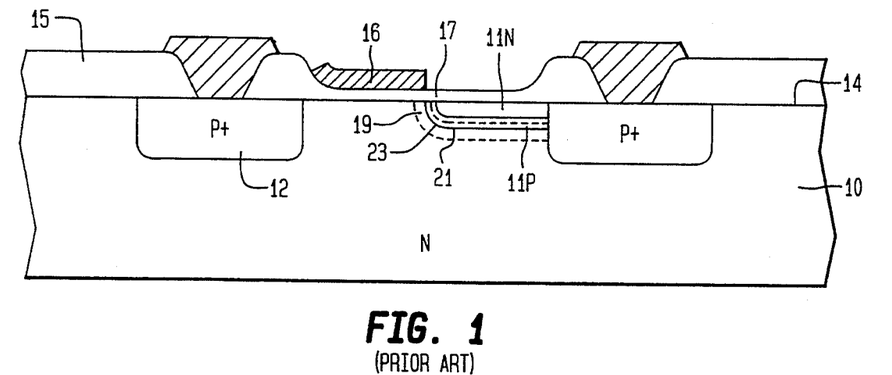
FIG. 1 diagrammatically illustrates an PMOS structure which incorporates a drain extension region comprising an 'N over P' lateral drift, drain-extension region.

The incorporation of such a drain extension region into a PMOS device is diagrammatically illustrated in FIG. 1 as comprising an 'N over P' lateral drift, drain-extension region 11, which is contiguous with a (P+) drain region 13 and extends along the surface 14 of an N type semiconductor (e.g. silicon) body 10 toward a (P+) source region 12. By an 'N over P' lateral drift region is meant that the lateral drift region 11 comprises an upper or topside N-type conductivity portion 11N, which adjoins a lower P-type conductivity portion 11P, so that, in effect the N portion is 'over' the P portion. Conversely, by a 'P over N' lateral drift region is meant that the lateral drift region comprises an upper P-type conductivity portion which adjoins a lower N-type conductivity portion, so that the P portion is 'over' the N portion.

The lateral drift region 11 may extend beneath a thick oxide layer 15 (typically formed by local oxidation) or under a thin (gate) oxide layer 17, with the lower P-type drain extension portion 11P of the N over P region extending to the surface 14 of the N body 10 beneath a gate electrode 16. In effect, the upper N region 11N may be considered as an upper gate and the N body 10 as the lower gate of a JFET, the channel of which is defined by P drain extension portion 11P.

The parameters of the lateral drift region 11 (e.g. doping profile in ions per square centimeter) are predefined such that, in the presence of a reverse bias applied between the drain region 13 and the body 10, P-drift region 11P becomes depleted of charge carriers prior to the occurrence of breakdown field in the depletion layer 19 that spreads from a reverse-biased drain-to-body PN junction 21, particularly at the sharp curvature portion 23 of the junction beneath gate electrode 18, where the total electrical field strength is increased by the presence of the bias applied to the gate. Typically, the doping per unit area of the P drift region portion 11P is a value on the order of 1 to $2 \times 10^{12}$ ions/cm$^2$, while N region portion 11N has a doping on the order of $1 \times 10^{12}$ ions/cm$^2$, in order to satisfy this fully depleted requirement.

The increased doping of P extension portion 11P reduces its resistance by about a factor of two, resulting in a PMOS device having lower on-resistance, since the drain current flows through the P extension portion 11P. The reduction in on-resistance in a PMOS device employed in an analog switching circuit is particularly important, since PMOS switching devices typically occupy approximately three times the semiconductor real estate as NMOS devices. Reducing PMOS size thus decreases die area. It also diminishes the mismatch in capacitance between P and N channel switch devices, because their sizes are more nearly equal, so that charge transfer errors which result from mismatched capacitances are also reduced.

In addition to signal processing applications having a need for high reverse breakdown MOS devices, there are also a number of applications which require CMOS devices having respectively different reverse breakdown characteristics (e.g. moderate voltages on the order of 20–80 volts for analog functions, such as analog switches and multiplexers, and high voltages on the order of 200–1000 volts for analog switching circuits). Because of the diversity of both the types and parametric variations of the device structures, the processes used to form such combined technology architectures are often complex, sometimes requiring upwards of fifteen masking steps to pattern and layout the topology of the wafer. Moreover, since there is both an increase in cost and a decrease in yield as the number of mask steps increases, it is desirable to reduce the number of steps required to incorporate all of the various types of devices that make up a multifunctional signal processing architecture. Unfortunately, conventional wafer processing to provide lateral drift regions customarily involves the use of both a special mask and a special doping step (e.g. ion implantation) exclusively dedicated to the formation of the drift region. As a consequence, there is an increase in both cost and complexity of the manufacturing process.

SUMMARY OF THE INVENTION

In accordance with the present invention, the number of additional processing steps that are dedicated exclusively to the formation of one type of increased voltage device, such as a dual drain extension region for a PMOS device, described above, is substantially reduced by using a common sequence of implant steps to form dual, complementary conductivity extensions for both drain and source regions of multiple MOS device types (both high and moderate voltage and N and P channel type structures).

More particularly, a first aspect of the present invention involves a method of manufacturing a CMOS architecture in which a PMOS device is formed in a first surface portion of a semiconductor layer having N type conductivity and an NMOS device is formed in a second surface portion of a semiconductor layer having P type conductivity. The PMOS device has respective first source and drain regions of P conductivity type formed in spaced apart portions of the first surface portion of the N-type semiconductor layer, a first gate insulator layer overlying the first surface portion of the semiconductor layer between the source and drain regions and a first gate electrode disposed on the first gate insulator layer. A field oxide overlies the semiconductor layer adjacent to the PMOS device. The complementary NMOS device has respective second source and drain regions of N conductivity type formed in spaced apart portions of the second surface portion of the P-type semiconductor layer, a second gate insulator layer overlying the second surface portion of the P-type semiconductor layer between the second source and drain regions, and a second gate electrode disposed on the second gate insulator layer. A field oxide overlies the semiconductor layer adjacent to the NMOS device.

Pursuant to the invention, using a common set of implants, respective dual conductivity type lateral extension regions, of the same complementary conductivity region configuration, are simultaneously formed in the N and P-type semiconductor layers, so to be contiguous with one or both of the first source and drain regions and one or both of the second source and drain regions of both the PMOS and the NMOS structures. The complementary conductivity lateral extension region configuration may be either an N over P or a P over N structure.

Simultaneous formation of complementary conductivity source and drain extension regions in both the PMOS and NMOS devices is carried out using their respective insulated gate structures and field insulator (oxide) layers as a self-aligning implant mask for implanting each of a prescribed P implant into each of the first and second surface portions of the semiconductor layer and a prescribed N implant into each of the first and second surface portions of the semiconductor layer. The source/drain extension N dopant is implanted to a depth different from the P implant, such that each of the dual conductivity lateral drain and source extension regions contains an N over P or a P over N structure of the same complementary conductivity region configuration.

In a preferred embodiment, the doping parameters of a respective dual conductivity lateral extension region are such that, in the presence of a reverse bias applied between its associated source/drain region and the semiconductor layer in which it is implanted, that one of the complementary polarity regions of the respective dual conductivity lateral extension region which has the same conductivity type as that of its associated source/drain region becomes totally depleted of charge carriers prior to the occurrence of breakdown field in a depletion layer extending from a reverse-biased source/drain-to-semiconductor layer PN junction.

In some reduced and moderate voltage applications, this total depletion requirement is unnecessary. In this case the doping parameters of a respective dual conductivity lateral extension region are such that that one of the complementary polarity regions of the respective dual conductivity lateral extension region which has the same conductivity type as that of its associated source/drain region is only partially depleted of charge carriers, upon the occurrence of breakdown field in a depletion layer that extends from a reverse-biased source/drain-to-semiconductor layer PN junction, in the presence of a reverse bias applied between its associated source/drain region and the semiconductor layer in which it is implanted.

In addition to forming lateral drift, extension regions for a moderate level reverse breakdown lateral CMOS structure, the dual extension region implant steps may also be employed to form source/drain extension regions in an additional high voltage device that is to be formed in the same integrated circuit architecture. Namely, where the CMOS architecture includes an additional MOS device formed in a third surface portion of an N or P semiconductor layer or body portion, its gate insulator structure and associated field oxide structure adjacent to its source/drain regions may be employed as an implant mask for the additional device. The P and N implants described above are also introduced through this additional implant mask topology, so as to form a further dual conductivity lateral source/drain extension region in the additional MOS device.

Where such a high voltage device is included as part of the integrated circuit architecture, it is an essential requirement that the doping parameters of the dual P and N implant sequence produce a dual conductivity lateral extension region such that, in the presence of a reverse bias applied between the third drain region and the third surface portion of the semiconductor layer in which it is implanted, that one of the complementary polarity regions of the dual conductivity lateral extension region which has the same conductivity type as that of the third drain region becomes totally depleted of charge carriers prior to the occurrence of breakdown field in a depletion layer which extends from a reverse-biased third drain region-to-semiconductor layer PN junction.

In the MOS device (either the PMOS device or the NMOS) whose body/layer conductivity is the same as that of the deeper implant (for example, the NMOS device for an N over P dual implant extension region), the deeper implant effectively merges with the body, so that the source/drain extension region is effectively reduced to a single surface region. However, because the deeper implant causes that portion of the body that is contiguous with the upper or surface implant to have an increased impurity concentration, it is possible to use a body having a lower doping concentration, thereby reducing the drain/body and source/body junction capacitance. The increased doping of upper portion of the body beneath the upper or surface extension region can be used to set the device threshold for the portion of the body at the surface underneath the gate between the source/drain extensions and the body. In can also act as a source/drain punch-through stopper, allowing use of a shorter channel length than would otherwise be possible.

DETAILED DESCRIPTION

As described briefly above, the semiconductor processing methodology of the present invention substantially reduces the number of processing steps required to form lateral source/drain extension regions of a CMOS structure by using the insulated gate and field oxide topology to mask a pair of extension region forming implants, thereby realizing dual region, either N over P or P over N, extensions for both drain and source regions of multiple MOS device types.

Figure 2:
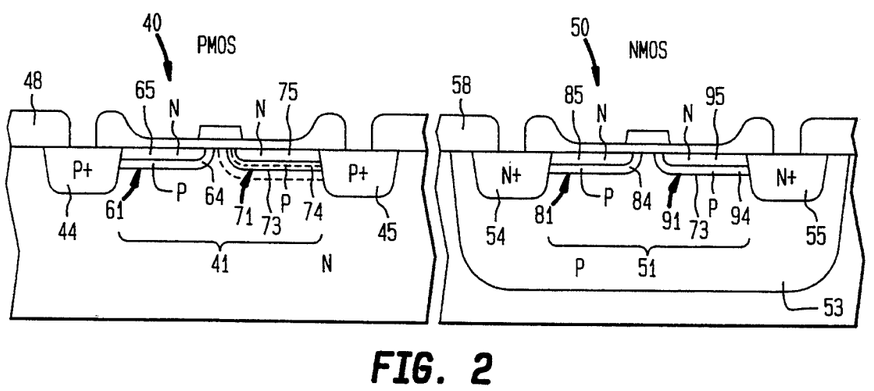
FIG. 2 diagrammatically shows a CMOS architecture in respective spaced apart portions of which a PMOS device and an NMOS device are formed, using the simultaneous dual implant processing methodology of the present invention.

FIG. 2 diagrammatically shows a CMOS architecture in respective spaced apart portions of which a PMOS device 40 and an NMOS device 50 are formed. In particular, PMOS device 40 is formed in a first surface portion 41 of a semiconductor body portion 43 having N type conductivity and an NMOS device 50 is formed in a second surface portion 51 of a complementary semiconductor well or body portion 53 having P type conductivity. PMOS device 40 has respective first source and drain regions 44 and 45 of P+ conductivity type formed in spaced apart portions of the first surface portion of the N-type semiconductor body portion 43, a first gate insulator layer 46 overlying the first surface portion of the semiconductor layer between source and drain regions 44, 45 and a first gate electrode 47 disposed on the first gate insulator layer 46. A field oxide layer 48 overlies the semiconductor body adjacent to PMOS device 40.

Complementary NMOS device 50 has respective second source and drain regions 54, 55 of N conductivity type formed in spaced apart portions of the second surface portion of the P-type semiconductor well portion 53, a second gate insulator layer 56 overlying the second surface portion of the P-type semiconductor body between the second source and drain regions, and a second gate electrode 57 disposed on the second gate insulator layer 56. A field oxide 58, which is typically a portion of field oxide layer 48, overlies the P-semiconductor well portion 54 adjacent to NMOS device 50.

Simultaneous formation of complementary conductivity source and drain extension regions in both the PMOS and NMOS devices is carried out using their respective insulated gate structures 46/47, 56/57 and field insulator (oxide) layers 48, 58 as a self-aligning implant mask for implanting each of a prescribed P implant a prescribed N implant into each of the first and second surface portions of the semiconductor body portions 43, 53. For purposes of providing an illustrative example, the extension regions are 'N over P' regions, so that the source/drain extension P dopant is implanted deeper than the N implant, which extends to the surface of CMOS architecture.

In PMOS device 40, the extension regions are shown as source extension region 61 and a drain extension region 71. Source extension region 61 comprises a lower or deeper implanted P-type source extension portion 64 and an upper or surface N-type drain extension portion 65. Each of P-type source extension portion 64 and N-type source extension portion 65 is contiguous with source region 44 and extends laterally toward insulated gate 47. Because P-type lateral extension portion 64 is implanted deeper into N-body 43, it extends further laterally beneath gate 46 than does surface implant 65. Similarly, drain extension region 71 comprises a lower or deeper implanted P-type drain extension portion 74 and an upper or surface N-type drain extension portion 75. Each of P-type drain extension portion 74 and N-type drain extension portion 75 is contiguous with drain region 45 and extends laterally toward insulated gate 47. Deeper implanted P-type lateral drain extension portion 74 extends further laterally beneath gate 46 than does surface implant 75.

In NMOS device 50, the extension regions are shown as an 'N over P' source extension region 81 and an 'N over P' drain extension region 91. Source extension region 81 comprises a lower or deeper implanted P-type source extension portion 84 and an upper or surface N-type drain extension portion 85. Each of P-type source extension portion 84 and N-type source extension portion 85 is contiguous with source region 54 and extends laterally toward insulated gate 57. Because P-type lateral extension portion 84 is implanted deeper into P-body 53, it extends further laterally beneath gate 56 than does surface implant 85. Similarly, drain extension region 91 comprises a lower or deeper implanted P-type drain extension portion 94 and an upper or surface N-type drain extension portion 95. Each of P-type drain extension portion 94 and N-type drain extension portion 95 is contiguous with drain region 55 and extends laterally toward insulated gate 57. Deeper implanted P-type lateral drain extension portion 74 extends further laterally beneath gate 46 than does surface implant 75.

As pointed out above, the doping parameters of a respective dual conductivity lateral source/drain extension region are such that, in the presence of a reverse bias applied between its associated source/drain region and the semiconductor layer in which it is implanted, that one of the complementary polarity regions of the respective dual conductivity lateral extension region which has the same conductivity type as that of its associated source/drain region becomes totally depleted of charge carriers prior to the occurrence of breakdown field in a depletion layer extending from a reverse-biased source/drain-to-semiconductor layer PN junction.

Figure 4:
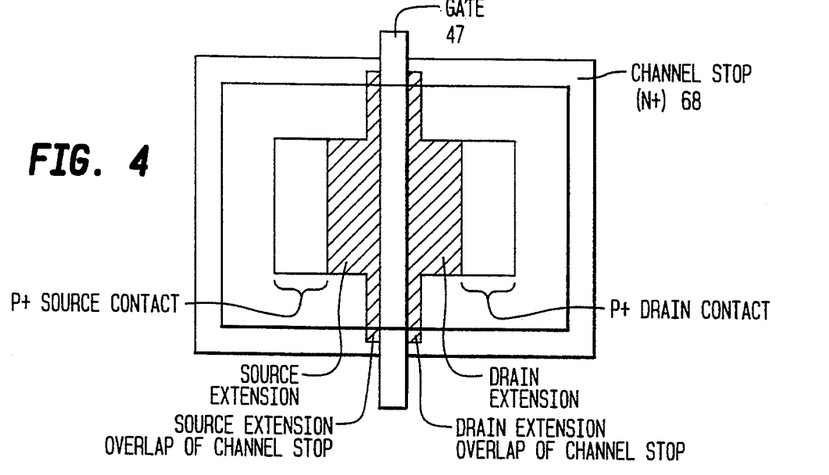
FIG. 4 shows a drain extension region of a PMOS device connected to an N substrate at an overlapping location of an N+ channel stop.

Considering the drain extension 71 of PMOS device 40, for example, the doping parameters of lower P portion 74 and upper N portion 75 are such that, in the presence of a reverse bias applied between P+ drain region 45 and N type semiconductor substrate, that one of the complementary polarity regions 74, 75 of the respective dual conductivity lateral drain extension region 71, which has the same conductivity type as its associated drain region (here lower P type drain extension portion 74), becomes totally depleted of charge carriers prior to the occurrence of a breakdown field in a depletion layer, shown at 76 as extending from reverse-biased drain-to-semiconductor layer PN junction 73. For example, the doping per unit area of the lower P drift region portion 74 may have a value on the order of 1 to $2 \times 10^{12}$ ions/cm$^2$, while upper N region portion 75 may have a doping on the order of $1 \times 10^{12}$ ions/cm$^2$, in order to satisfy this fully depleted requirement. Thus, an 'N over P' doping profile allows the net doping of P portion 75 to be about a factor of two higher than for a P layer only depletable drain extension. Also, for the drain extension region 71 of the PMOS device, surface N extension portion 75 must also totally deplete prior to breakdown at the junction interface 79 between the drain 45 and N surface extension portion 75. This may be facilitated by having the N drain extension region portion 75 connected to the N substrate at some point, such as shown in FIG. 4 at an overlapping location of the body contact or an N+ channel stop 68. The doping and thickness of the N and P extension implants are defined such that the surface N portion 75 totally depletes prior to the deeper P portion 74, so that no non-depleted portion of the surface N portion 75 is available to reduce breakdown. At a higher voltage, less than the P extension portion to N substrate breakdown voltage, P portion 74 totally depletes.

It should be noted that in some reduced and moderate voltage applications, the total depletion requirement is unnecessary. In this case the doping parameters of a respective dual conductivity lateral extension region are such that that one of the complementary polarity regions of the respective dual conductivity lateral extension region which has the same conductivity type as that of its associated source/drain region is only partially depleted of charge carriers, upon the occurrence of breakdown field in a depletion layer that extends from a reverse-biased source/drain-to-semiconductor layer PN junction, in the presence of a reverse bias applied between its associated source/drain region and the semiconductor layer in which it is implanted.

Figure 3:
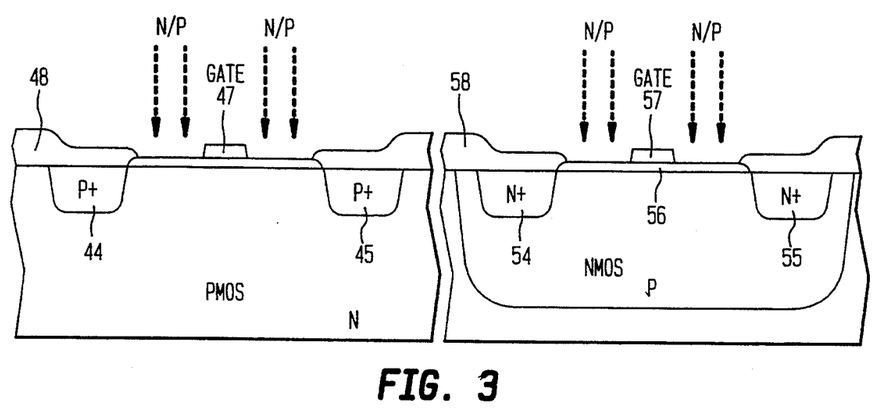
FIG. 3 diagrammatically illustrates an exemplary embodiment of the dual implant process of the invention, which employs the relatively thick field oxide overlying the surface of the semiconductor body in which the source/drain regions have been formed and the insulated gate structure as an implant mask.

Because the doping concentration of the P+ source and drain regions is substantially elevated (e.g. on the order of $1 \times 10^{18}$ to $1 \times 10^{21}$ atoms cm$^{-3}$ surface concentration) compared with those of both the N and P implants used to form the source/drain extensions, the source and drain region doping values effectively overcompensate the doping concentration of both extension region implants, so that the intended net profile geometry is maintained. Thus, in an exemplary embodiment, each of the source and drain extension implants 61 and 71 may be introduced subsequent to the formation of source regions 44 and drain region 45, using the relatively thick field oxide 48 overlying the surface of the semiconductor body in which the source/drain regions have been formed and the insulated gate structure 46, 47 as an implant mask, as diagrammatically illustrated in FIG. 3. Because the thickness (e.g. on the order of 100 to 2000 Angstroms) of the gate oxide layer 46 is substantially less than field oxide (on the order of 4000 to 15,000 Angstroms), the implanted ions readily penetrate gate oxide layer 46 to form extensions 61 and 71, but are effectively blocked by the field oxide layer and insulated gate structure. In other words, the implanting of source/drain extensions 61, 71 does not require the formation of any additional mask atop the topology of the insulated gate and field oxide structure explicitly dedicated to defining the source/drain extension profiles. The increased energy for the deeper P implant also causes the P drift region portion to extend further beneath the gate oxide layer 46, than does the surface N extension region, as shown.

In the NMOS device 50, because the P well region, into which the 'N over P' source/drain extension regions are introduced, has the same conductivity type as the lower or deeper implanted P-type extension portions 84, 94, these lower extension portions effectively merge with the well or body portion 53, so that the source/drain extension regions are effectively reduced to surface N regions 85, 95. Such surface N extension portions carry current and contribute a term to on-resistance, just as in a conventional single region extension.

However, because the deeper P implant causes that portion of the P body 53 that is contiguous with the upper or surface N implant to have an increased impurity concentration (e.g. from a value on the order of $1-2 \times 10^{16}$cm$^{-3}$ to a value on the order of $1-5 \times 10^{17}$cm$^{-3}$), it is possible to use a body or well portion having a lower doping concentration, thereby reducing the drain/body and source/body junction capacitance. The implant-based increased doping of upper portion of the body or well portion 53 beneath the upper or surface N extension region can be used to set the device threshold for the portion of the body at the surface underneath the gate between the source/drain extensions and the body. In can also act as a source/drain punch-through stopper, allowing use of a shorter channel length than would otherwise be possible. It may again be noted that the increased energy for the deeper P implant causes the well-merging P implant to extend further beneath the gate oxide layer 56, than do the surface N extension source/drain regions 85, 95. The NMOS structure also provides a minimum self-alignment feature in the dual implant process, just as during the formation of the PMOS extension architecture described above.

Also, as is the case with the source/drain extensions of the PMOS device, that are introduced simultaneously with those of the NMOS device, since the doping concentration of the N+ source and drain regions is substantially elevated, compared with those of both the N and P implants used to form the source/drain extensions, the source and drain region doping values effectively overcompensate the doping concentration of both extension region implants, so that the intended net profile geometry is maintained. Thus, in the exemplary NMOS structure of FIG. 3, each of the source and drain extension implants 81 and 91 may be introduced subsequent to the formation of source region 54 and drain region 55, using the relatively thick field oxide 58 and insulated gate structure 56, 57 as an implant mask. Again, since the thickness of the gate oxide layer 56 is substantially less than field oxide, the implanted ions readily penetrate gate oxide layer 56 to form extensions 81 and 91, but are effectively blocked by the field oxide layer and insulated gate structure. Consequently, the implanting of source/drain extensions 81, 91 does not require the formation of any additional mask atop the topology of the insulated gate and field oxide structure explicitly dedicated to defining the source/drain extension profiles.

In addition to forming lateral drift, extension regions for moderate voltage N and P channel lateral CMOS structures, the dual extension region implant steps may also be employed to form source/drain extension regions in an additional high voltage device that is to be formed in the same integrated circuit architecture. Namely, where the CMOS architecture includes one or more additional MOS devices formed in a third surface portion of an N or P semiconductor layer or body portion, its gate insulator structure and associated field oxide structure adjacent to its source/drain regions may be employed as an implant mask for the additional device. The P and N implants described above are also simultaneously introduced through this additional implant mask topology, so as to form a further dual conductivity lateral source/drain extension region in the additional MOS device.

Where a high voltage device (having a reverse breakdown voltage range on the order of 100-1000 V, for example) is included as part of the integrated circuit architecture, it is an essential requirement that the doping parameters of the dual P and N implant sequence produce a dual conductivity lateral extension region such that, in the presence of a reverse bias applied between its drain region and the semiconductor body portion in which it is implanted, that one of the complementary polarity regions of the dual conductivity lateral extension region which has the same conductivity type as that of the third drain region becomes totally depleted of charge carriers prior to the occurrence of breakdown field in a depletion layer which extends from a reverse-biased drain region-to-semiconductor body PN junction.

Although in the above-described embodiments, dual extension implants are performed for both the source and drain regions using the field oxide and insulated gate structure without the need of an explicit masking step, it should be realized that explicit masks may be used to delineate surface features in the course of the implants including, but not limited to, confining the dual extension implants to only the drain region where high reverse breakdown is not required from the source region to the body. It should also be realized that such explicit masking steps are not required.

Figure 5:
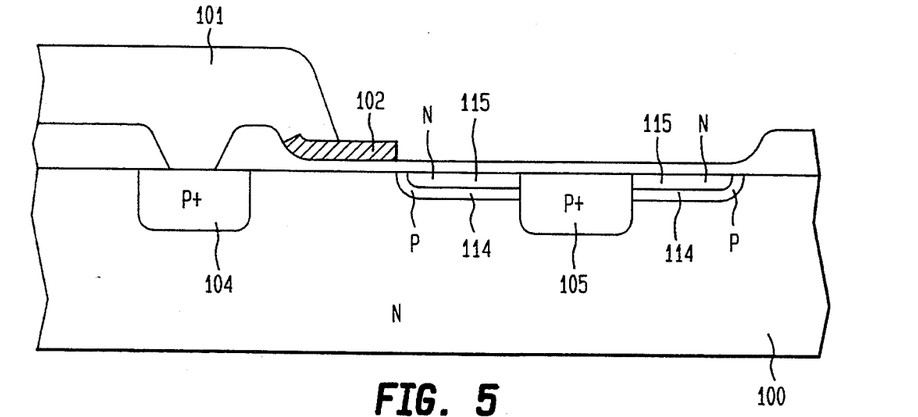
FIG. 5 shows a PMOS architecture resident in an N-type semiconductor body having a separate mask layer which overlies a source region, but leaves a drain region unmasked beneath gate oxide layer.
Figure 6:
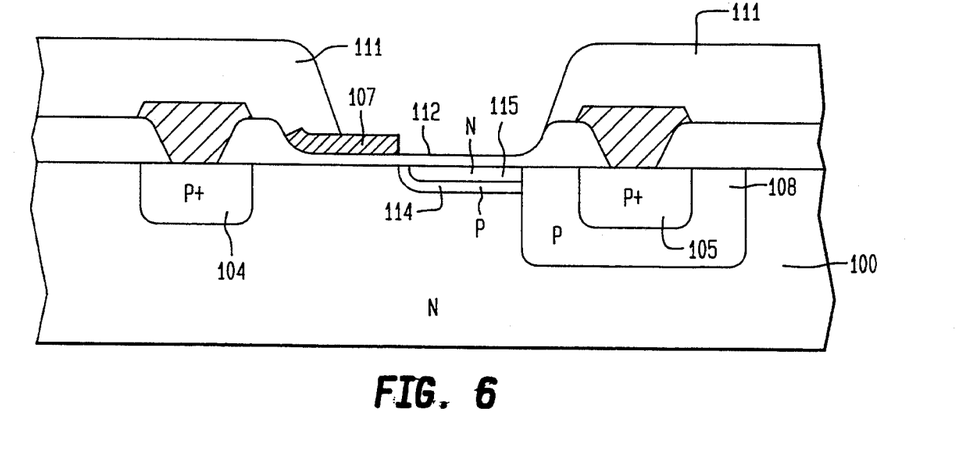
FIG. 6 shows a PMOS architecture similar to that of FIG. 5, but with P+ drain region surrounded by or formed within a P well region, in order to mitigate the higher field due to junction curvature.

Examples of the use of such a drain-only delimiting mask are illustrated in FIGS. 5 and 6. FIG. 5 shows a PMOS architecture resident in an N-type semiconductor body 100, having a separate mask layer 101 which overlies a source region 104, but leaves a drain region 105 unmasked beneath gate oxide layer 106. Here, the drain extension comprised of N-type surface implant portion 115 and deeper P-type implant portion 114 completely surrounds P+ drain region 105 in order to increase breakdown and minimize junction curvature on all sides of the drain region. FIG. 6 shows a PMOS architecture similar to that of FIG. 5, but with P+ drain region surrounded by or formed within a P well region 108, in order to mitigate the higher field due to junction curvature. Here, the topology of explicit mask layer 111 overlies the source and drain regions, but leaves surface portion 112 of substrate 100 unmasked beneath gate oxide layer 106. The dual conductivity drain extension is implanted so as to be contiguous with P drain well region 108 and to extend beneath gate 107.

As will be appreciated from the foregoing description, the number of additional processing steps that are dedicated exclusively to the formation of one type of increased voltage device MOS device is substantially reduced in accordance with the present invention by using a common sequence of implant steps to form dual, complementary conductivity extensions for both drain and source regions of multiple MOS device types, including both high and moderate voltage and N and P channel type structures. Advantageously the dual implant methodology can be carried out with no explicit masking steps, yielding MOS device which have source/drain extension regions that are self aligned to the gate and have minimal overlap capacitance. Thus, the methodology yields a device architecture that possesses improved breakdown characteristics, low overlap capacitance and thin gate oxide.

As mentioned previously, the dual implant source/drain extensions may be either 'N over P' or 'P over N'. Thus, although the foregoing example details an 'N over P' structure, the invention may alternatively use a 'P over N' implant extension configuration. In the latter instance, the lower N region would effectively 'merge' into the N body, for a PMOS device, while a separately definable N extension portion would form a drain extension PN junction with the P body for an NMOS device.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a CMOS architecture comprising the steps of:
   (a) forming a PMOS device in a first surface portion of a semiconductor layer having N type conductivity and an NMOS device in a second surface portion of said semiconductor layer having P type conductivity, said PMOS device having respective first source and drain regions of P conductivity type formed in spaced apart portions of said first surface portion of said semiconductor layer, a first gate insulator layer overlying said first surface portion of said semiconductor layer between said first source and drain regions and a first gate electrode disposed on said first gate insulator layer above a first channel region, and said NMOS device having respective second source and drain regions of N conductivity type formed in spaced apart portions of said second surface portion of said semiconductor layer, a second gate insulator layer overlying said second surface portion of said semiconductor layer between said second source and drain regions, and a second gate electrode disposed on said second gate insulator layer above a second channel region; and
   (b) forming respective dual conductivity type lateral extension regions, contiguous with at least one of the first source and drain regions and extending laterally therefrom toward said first channel region, and also contiguous with at least one of the second source and drain regions and extending laterally therefrom toward said second channel region, each respective dual conductivity type lateral extension region containing a first lateral extension region portion of a first conductivity type overlying and contacting a second lateral extension region portion of a second conductivity type.

2. A method according to claim 1, wherein step (b) comprises forming N over P lateral extension regions that are contiguous with at least one of the first source and drain regions and at least one of the second source and drain regions, a respective N over P lateral extension region containing a first lateral extension region portion of P conductivity type and second lateral extension region portion of N conductivity type disposed above said first lateral extension region portion of P conductivity type.

3. A method according to claim 1, wherein step (b) comprises forming P over N lateral extension regions that are contiguous with at least one of the first source and drain regions and at least one of the second source and drain regions, a respective P over N lateral extension region containing a first lateral extension region portion of N conductivity type and second lateral extension region portion of P conductivity type disposed above said first lateral extension region portion of N conductivity type.

4. A method according to claim 1, wherein step (b) comprises forming a first dual conductivity type lateral extension source region contiguous with said first source region, a first dual conductivity type lateral extension drain region contiguous with said first drain region, a second dual conductivity type lateral extension source region contiguous with said second source region, and a second dual conductivity type lateral extension drain region contiguous with said second drain region.

5. A method of manufacturing a CMOS architecture comprising the steps of:

(a) forming a PMOS device formed in a first surface portion of a semiconductor layer having N type conductivity and an NMOS device formed in a second surface portion of said semiconductor layer having P type conductivity, said PMOS device having respective first source and drain regions of P conductivity type formed in spaced apart portions of said first surface portion of said semiconductor layer, a first gate insulator layer overlying said first surface portion of said semiconductor layer between said source and drain regions and a first gate electrode disposed on said first gate insulator layer overlying a first channel region, and said NMOS device having respective second source and drain regions of N conductivity type formed in spaced apart portions of said second surface portion of said semiconductor layer, a second gate insulator layer overlying said second surface portion of said semiconductor layer between said second source and drain regions, and a second gate electrode disposed on said second gate insulator layer overlying a second channel region; and (b) forming, simultaneously, respective dual conductivity lateral drain and source extension regions in each of said PMOS and NMOS devices, each of said dual conductivity lateral drain extension regions being contiguous with and extending laterally from a respective drain region toward a respective channel region and containing a first lateral extension region portion of a first conductivity type overlying and contacting a second lateral extension region portion, of a second conductivity type, and each of said dual conductivity lateral source extension regions being contiguous with and extending laterally toward a respective channel region and containing a third lateral extension region of said first conductivity type overlying and contacting a fourth lateral extension region portion of said second conductivity type.

6. A method according to claim 5, wherein step (b) comprises forming each of said dual conductivity drain and source lateral extension regions as an N over P configuration, which contains a lateral extension region portion of P conductivity type and a lateral extension region portion of N conductivity type disposed above said lateral extension region portion of P conductivity type.

7. A method according to claim 5, comprising forming each of said dual conductivity drain and source lateral extension regions as a P over N configuration, which contains a lateral extension region portion of N conductivity type and a lateral extension region portion of P conductivity type disposed above said lateral extension region portion of N conductivity type.

8. A method of manufacturing a CMOS architecture comprising the steps of:

(a) forming a PMOS device in a first surface portion of a semiconductor layer having N type conductivity and an NMOS device formed in a second surface portion of said semiconductor layer of P type conductivity, said PMOS device having respective first source and drain regions of P conductivity type formed in spaced apart portions of said first surface portion of said semiconductor layer, a first gate insulator layer overlying said first surface portion of said semiconductor layer between said source and drain regions and a first gate electrode disposed on said first gate insulator layer overlying a first channel region, thereby forming a first insulated gate structure, and said NMOS device having respective second source and drain regions of N conductivity type formed in spaced apart portions of said second surface portion of said semiconductor layer, a second gate insulator layer overlying said second surface portion of said semiconductor layer between said second source and drain regions, and a second gate electrode disposed on said second gate insulator overlying a second channel region, thereby forming a second insulated gate structure; and (b) using said first and second insulated gate structures as masks, conducting a prescribed P implant into each of said first and second surface portions of said semiconductor layer and conducting a prescribed N implant into each of said first and second surface portions of said semiconductor layer to a depth different from said prescribed P implant, so as to form first dual conductivity lateral drain and source extension regions in said PMOS device extending laterally from said first source and drain regions respectively toward said first channel, and second dual conductivity lateral drain and source extension regions in said NMOS device extending laterally from said second source and drain regions respectively toward said second channel, such that each of said dual conductivity lateral drain and source extension regions contains a first lateral extension region portion of a first conductivity type overlying and contacting a second lateral extension region portion of a second conductivity type.

9. A method according to claim 8, wherein the doping parameters of a respective dual conductivity lateral extension region are such that, in the presence of a reverse bias applied between its associated source/drain region and the semiconductor layer in which it is formed, one of the complementary polarity regions of said respective dual conductivity lateral extension region becomes totally depleted of charge carriers prior to the occurrence of breakdown field in a depletion layer that extends from a reverse-biased source/drain-to-semiconductor layer PN junction.

10. A method according to claim 8, wherein the doping parameters of a respective dual conductivity lateral extension region are such that, in the presence of a reverse bias applied between its associated source/drain region and the semiconductor layer in which it is formed, that one of the complementary polarity regions of said respective dual conductivity lateral extension region which has the same conductivity type as that of its associated source/drain region becomes totally depleted of charge carriers prior to the occurrence of breakdown field in a depletion layer that extends from a reverse-biased source/drain-to-semiconductor layer PN junction.

11. A method according to claim 8, wherein the doping parameters of a respective dual conductivity lateral extension region are such that, in the presence of a reverse bias applied between its associated source/drain region and the semiconductor layer in which it is formed, that one of the complementary polarity regions of said respective dual conductivity lateral extension region which has the same conductivity type as that of its associated source/drain region is only partially depleted of charge carriers upon the occurrence of breakdown field in a depletion layer that extends from a reverse-biased source/drain-to-semiconductor layer PN junction.

12. A method according to claim 8, wherein step (a) further includes forming, within said CMOS architecture, an additional MOS device in a third surface portion of said semiconductor layer of one of said N and P conductivity types, said additional MOS device having respective third source and drain regions of a second of said N and P conductivity types formed in spaced apart portions of said third surface portion of said semiconductor layer, a third gate insulator layer overlying said third surface portion of said semiconductor layer between said third source and drain regions and a third gate electrode disposed on said third gate insulator layer overlying a third channel region, thereby forming a third insulated gate structure, and wherein step (b) comprises using said third insulated gate structure as a mask, conducting said prescribed P implant into said third surface portion of said semiconductor layer and conducting said prescribed N implant into said third surface portion of said semiconductor layer, so as to form a further dual conductivity lateral drain extension region in said additional MOS device, such that said further dual conductivity lateral drain extension region extends laterally from said third drain region toward said third channel region and contains a respective first lateral extension region portion of said first conductivity type overlying and contacting a respective second lateral extension region portion of said second conductivity type.

13. A method according to claim 12, wherein the third drain region of said additional MOS device comprises a drain body portion having an impurity concentration less than that of said third source region.

14. A method according to claim 13, wherein the doping parameters of said further dual conductivity lateral drain extension region are such that, in the presence of a reverse bias applied between said third drain region and the third surface portion of said semiconductor layer in which it is formed, that one of the complementary polarity regions of said further dual conductivity lateral drain extension region which has the same conductivity type as that of said third drain region becomes totally depleted of charge carriers prior to the occurrence of breakdown field in a depletion layer that extends from a reverse-biased third drain region-to-semiconductor layer PN junction.

15. A method according to claim 12, wherein step (b) comprises forming said further dual conductivity lateral drain extension region in said additional MOS device such that said further dual conductivity lateral drain extension region surrounds said third drain region.

16. A method according to claim 15, wherein the doping parameters of said further dual conductivity lateral drain extension region are such that, in the presence of a reverse bias applied between said third drain region and the third surface portion of said semiconductor layer in which it is formed, that one of the complementary polarity regions of said further dual conductivity lateral drain extension region which has the same conductivity type as that of said third drain region becomes totally depleted of charge carriers prior to the occurrence of breakdown field in a depletion layer that extends from a reverse-biased third drain region-to-semiconductor layer PN junction.

17. A CMOS architecture comprising a PMOS device formed in a first surface portion of a semiconductor layer having N type conductivity and an NMOS device formed in a second surface portion of said semiconductor layer having P type conductivity, said PMOS device having respective first source and drain regions of P conductivity type formed in spaced apart portions of said first surface portion of said semiconductor layer, a first gate insulator layer overlying said first surface portion of said semiconductor layer between said source and drain regions and a first gate electrode disposed on said first gate insulator layer and overlying a first channel region, and said NMOS device having respective second source and drain regions of N conductivity type formed in spaced apart portions of said second surface portion of said semiconductor layer, a second gate insulator layer overlying said second surface portion of said semiconductor layer between said second source and drain regions, and a second gate electrode disposed on said second gate insulator layer and overlying a second channel region, and wherein respective dual conductivity type lateral extension regions are contiguous with at least one of the first source and drain regions and extend laterally therefrom toward said first channel region and with at least one of the second source and drain regions and extend laterally therefrom toward said second channel region, each respective dual conductivity type lateral extension region containing a first lateral extension region portion of a first conductivity type overlying and contacting a second lateral extension region portion of a second conductivity type.

18. A CMOS architecture according to claim 17, wherein each of said respective dual conductivity type lateral extension regions comprises an N over P lateral extension region, a respective N over P lateral extension region containing a first lateral extension region portion of P conductivity type and second lateral extension region portion of N conductivity type disposed above said first lateral extension region portion or P conductivity type.

19. A CMOS architecture according to claim 17, wherein each of said respective dual conductivity type lateral extension regions comprises an P over N lateral extension region, a respective P over N lateral extension region containing a first lateral extension region portion of N conductivity type and second lateral extension region portion of P conductivity type disposed above said first lateral extension region portion of N conductivity type.

20. A CMOS architecture according to claim 17, wherein said respective dual conductivity type lateral extension regions comprise a first dual conductivity type lateral extension source region contiguous with and extending laterally from said first source region toward said first channel region, a first dual conductivity type lateral extension drain region contiguous with and extending laterally from said first drain region toward said first channel region, a second dual conductivity type lateral extension source region contiguous with and extending laterally from said second source region toward said second channel region, and a second dual conductivity type lateral extension drain region contiguous with and extending laterally from said second drain region toward said second channel region.

21. A CMOS architecture according to claim 17, wherein the doping parameters of a respective dual conductivity lateral extension region are such that, in the presence of a reverse bias applied between its associated source/drain region and the semiconductor layer in which it is formed, one of the complementary polarity regions of said respective dual conductivity lateral extension region becomes totally depleted of charge carriers prior to the occurrence of breakdown field in a depletion layer that extends from a reverse-biased source/drain-to-semiconductor layer PN junction.

22. A CMOS architecture according to claim 17, wherein the doping parameters of a respective dual conductivity lateral extension region are such that, in the presence of a reverse bias applied between its associated source/drain region and the semiconductor layer in which it is formed, that one of the complementary polarity regions of said respective dual conductivity lateral extension region which has the same conductivity type as that of its associated source/drain region becomes totally depleted of charge carriers prior to the occurrence of breakdown field in a depletion layer that extends from a reverse-biased source/drain-to-semiconductor layer PN junction.

23. A CMOS architecture according to claim 17, wherein the doping parameters of a respective dual conductivity lateral extension region are such that, in the presence of a reverse bias applied between its associated source/drain region and the semiconductor layer in which it is formed, that one of the complementary polarity regions of said respective dual conductivity lateral extension region which has the same conductivity type as that of its associated source/drain region is only partially depleted of charge carriers upon the occurrence of breakdown field in a depletion layer that extends from a reverse-biased source/drain-to-semiconductor layer PN junction.

24. A CMOS architecture according to claim 17, further comprising an additional MOS device formed in a third surface portion of said semiconductor layer of one of said N and P conductivity types, said additional MOS device having respective third source and drain regions of a second of said N and P conductivity types formed in spaced apart portions of said third surface portion of said semiconductor layer, a third gate insulator layer overlying said third surface portion of said semiconductor layer between said third source and drain regions and a third gate electrode disposed on said third gate insulator layer overlying a third channel region, thereby forming a third insulated gate structure, and a further dual conductivity lateral drain extension region formed in said additional MOS device, such that said further dual conductivity lateral drain extension region extends laterally from said third drain region and contains a respective first lateral extension region portion of a first conductivity type overlying and contacting a second respective lateral extension region portion of a second conductivity type.

25. A CMOS architecture according to claim 24, wherein the third drain region of said additional MOS device comprises a drain body portion having an impurity concentration less than that of said third source region.

26. A CMOS architecture according to claim 24, wherein the doping parameters of a respective dual conductivity lateral extension region are such that, in the presence of a reverse bias applied between its associated source/drain region and the 5 semiconductor layer in which it is formed, that one of the complementary polarity regions of said respective dual conductivity lateral extension region which has the same conductivity type as that of its associated source/drain region becomes totally depleted of charge carriers prior to the occurrence of breakdown field in a depletion layer that extends from a reverse-biased source/drain-to-semiconductor layer PN junction.

27. A CMOS architecture according to claim 24, wherein said further dual conductivity lateral drain extension region surrounds said third drain region.

28. A CMOS architecture according to claim 27, wherein the doping parameters of said further dual conductivity lateral extension region are such that, in the presence of a reverse bias applied between said third drain region and the third surface portion of said semiconductor layer in which it is formed, that one of the complementary polarity regions of said further dual conductivity lateral extension region which has the same conductivity type as that of said third drain region becomes totally depleted of charge carriers prior to the occurrence of breakdown field in a depletion layer that extends from a reverse-biased third drain region-to-semiconductor layer PN junction.

* * * * *